United States Patent
Loy et al.

(10) Patent No.: US 11,398,525 B2
(45) Date of Patent: Jul. 26, 2022

(54) RESISTIVE MEMORY ELEMENTS HAVING CONDUCTIVE ISLANDS EMBEDDED WITHIN THE SWITCHING LAYER

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 168 days.

(21) Appl. No.: 17/009,288

(22) Filed: Sep. 1, 2020

(65) Prior Publication Data
US 2022/0069013 A1    Mar. 3, 2022

(51) Int. Cl.
*H01L 27/24* (2006.01)
*H01L 45/00* (2006.01)

(52) U.S. Cl.
CPC .......... *H01L 27/2472* (2013.01); *H01L 45/08* (2013.01); *H01L 45/1233* (2013.01); *H01L 45/1253* (2013.01); *H01L 45/146* (2013.01); *H01L 45/16* (2013.01)

(58) Field of Classification Search
CPC . H01L 27/2472; H01L 45/08; H01L 45/1233; H01L 45/1253
See application file for complete search history.

(56) References Cited

PUBLICATIONS

Desmond Jia Jun Loy et al., "Non-Volatile Memory Elements With Filament Confinement", filed Jun. 20, 2019 as U.S. Appl. No. 16/447,460.
Feng, W., Shima, H., Ohmori, K. et al. Investigation of switching mechanism in HfOx-ReRAM under low power and conventional operation modes. Sci Rep 6, 39510 (2016).
K. Chuang et al., "Effects of Electric Fields on the Switching Properties Improvements of RRAM Device With a Field-Enhanced Elevated-Film-Stack Structure," in IEEE Journal of the Electron Devices Society, vol. 6, pp. 622-626, 2018, doi: 10.1109/JEDS.2018.2832542.
Niu, G., Calka, P., Auf der Maur, M. et al. Geometric conductive filament confinement by nanotips for resistive switching of HfO2-RRAM devices with high performance. Sci Rep 6, 25757 (2016).
Mehr et al., "Ultra sharp crystalline silicon tip array used as field emitter", Microelectronic Engineering vol. 30, Issues 1-4, Jan. 1996, pp. 395-398.
Desmond Jia Jun Loy et al., "A Memory Device and a Method for Forming the Memory Device", filed Jul. 17, 2019 as U.S. Appl. No. 16/513,745.

*Primary Examiner* — Marvin Payen
(74) *Attorney, Agent, or Firm* — Thompson Hine LLP

(57) ABSTRACT

Structures for a resistive memory element and methods of forming a structure for a resistive memory element. The resistive memory element includes a first switching layer, a second switching layer, a conductive spacer, a first electrode, and a second electrode. The first switching layer includes a portion positioned between the first electrode and the conductive spacer, the second switching layer includes a portion positioned between the second electrode and the conductive spacer, and the conductive spacer is positioned between the portion of the first switching layer and the portion of the second switching layer.

20 Claims, 7 Drawing Sheets

RESISTIVE MEMORY ELEMENTS HAVING CONDUCTIVE ISLANDS EMBEDDED WITHIN THE SWITCHING LAYER

BACKGROUND

The invention relates to integrated circuits and semiconductor device fabrication and, more specifically, to structures for a resistive memory element and methods of forming a structure for a resistive memory element.

A resistive random-access memory (ReRAM or RRAM) device provides one type of embedded non-volatile memory technology. Because its resistive memory elements are non-volatile, the stored bits of data are retained by the resistive random-access memory device when the memory elements are not powered. The non-volatility of a resistive random-access memory device contrasts with volatile memory technologies, such as a static random-access memory (SRAM) device in which the stored content is eventually lost when unpowered and a dynamic random-access memory (DRAM) device in which the stored content is lost if not periodically refreshed.

Data is stored in a resistive memory element by changing the resistance across a switching layer to provide different information-storage states—a high-resistance state and a low-resistance state—representing the stored bits of data. The switching layer can be modified by applying a bias voltage sufficient to create one or more filaments as conductive paths bridging across the thickness of the switching layer, which writes the low-resistance state. The filaments are destroyed, also by the application of a bias voltage, to write the high-resistance state.

Improved structures for a resistive memory element and methods of forming a structure for a resistive memory element are needed.

SUMMARY

According to an embodiment of the invention, a structure includes a resistive memory element having a first switching layer, a second switching layer, a conductive spacer, a first electrode, and a second electrode. The first switching layer includes a portion positioned between the first electrode and the conductive spacer, the second switching layer includes a portion positioned between the second electrode and the conductive spacer, and the conductive spacer is positioned between the portion of the first switching layer and the portion of the second switching layer.

According to another embodiment of the invention, a method of forming a structure for a resistive memory element is provided. The method includes forming a first electrode, forming a first switching layer, forming a conductive spacer on the first switching layer, forming a second switching layer on the first switching layer and the conductive spacer, and forming a second electrode on the second switching layer. The first switching layer includes a portion positioned between the first electrode and the conductive spacer, the second switching layer includes a portion positioned between the second electrode and the conductive spacer, and the conductive spacer is positioned between the portion of the first switching layer and the portion of the second switching layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
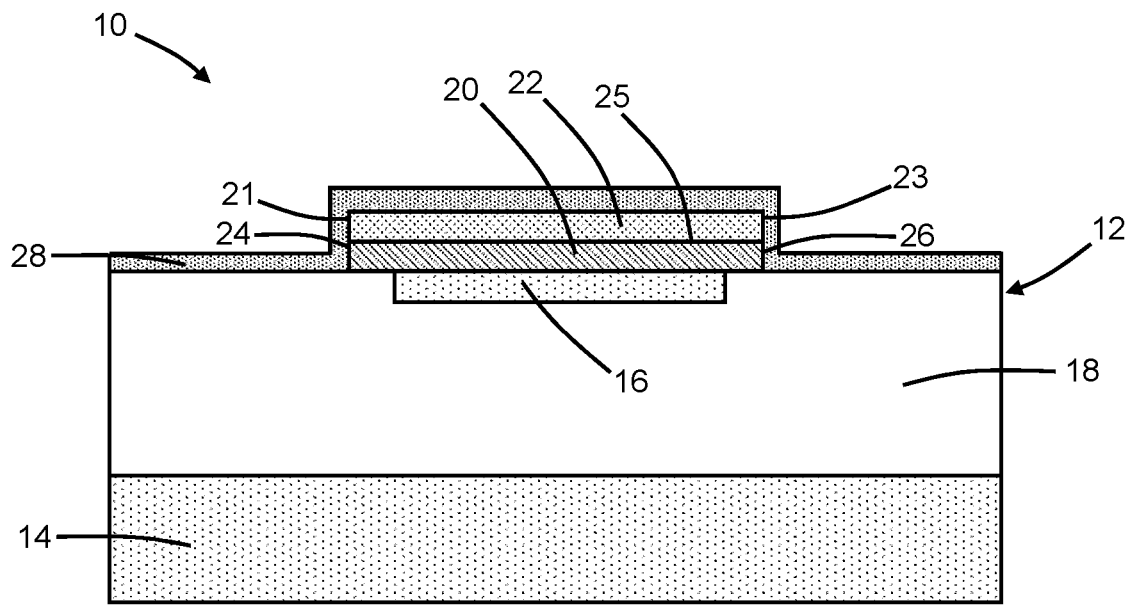
FIGS. 1-5 are diagrammatic cross-sectional views of a structure for a resistive memory element at successive fabrication stages of a processing method in accordance with embodiments of the invention.

With reference to FIG. 1 and in accordance with embodiments of the invention, a structure 10 for a resistive memory element is disposed in a metallization level of an interconnect structure 12. The interconnect structure 12 is fabricated by middle-of-line and back-end-of-line processing over a substrate 14. The structure 10 may be positioned over a metal feature 16 in one of the metallization levels, such as the M2 metallization level, of the interconnect structure. The interconnect structure 12 includes an interlayer dielectric layer 18 that may be comprised of a dielectric material, such as silicon dioxide, and the metal feature 16 may be comprised of a metal, such as copper or aluminum.

The structure 10 includes a bottom electrode 20 arranged over the metal feature 16 and an insulator layer 22 arranged over the bottom electrode 20 in a stacked arrangement. In an embodiment, the insulator layer 22 may be in direct contact with the top surface 25 of the bottom electrode 20. The bottom electrode 20 includes a side surface 24, a side surface 26 that is opposite to the side surface 24, and a top surface 25 adjacent to the insulator layer 22. The side surfaces 24, 26 define respective corners of the bottom electrode 20 at the top surface 25. In an embodiment, the insulator layer 22 may extend across the top surface 25 of the bottom electrode 20 from the side surface 24 to the side surface 26. In an embodiment, the insulator layer 22 may fully cover the top surface 25 of the bottom electrode 20. The insulator layer 22 has opposite side surfaces 21, 23 that may be aligned with the side surfaces 24, 26 of the bottom electrode 20.

The bottom electrode 20 and insulator layer 22 may be formed by depositing layers of their constituent materials on the interlayer dielectric layer 18 and metal feature 16, and then patterning the deposited layers with lithography and etching processes. The etching process patterning the bottom electrode 20 and insulator layer 22 may be a reactive ion etching process. The bottom electrode 20 may be comprised of a metal, such as platinum, ruthenium, titanium nitride, or tantalum nitride, deposited by, for example, physical vapor deposition. The insulator layer 22 may be a dielectric layer comprised of a dielectric material, such as silicon dioxide or silicon nitride.

A switching layer 28 is formed over the interlayer dielectric layer 18 and the stacked bottom electrode 20 and insulator layer 22. In an embodiment, the switching layer 28 may be comprised of a metal oxide, such as magnesium oxide, tantalum oxide, hafnium oxide, titanium oxide, aluminum oxide, or silicon dioxide, and may be conformally deposited with a nominally uniform thickness. The switching layer 28 includes portions that are respectively in direct contact with the side surfaces 24, 26 of the bottom electrode 20. In an embodiment, the switching layer 28 may be in direct contact with the side surfaces 24, 26 of the bottom electrode 20, as well as in direct contact with the side surfaces 21, 23 and top surface of the insulator layer 22.

Figure 2:
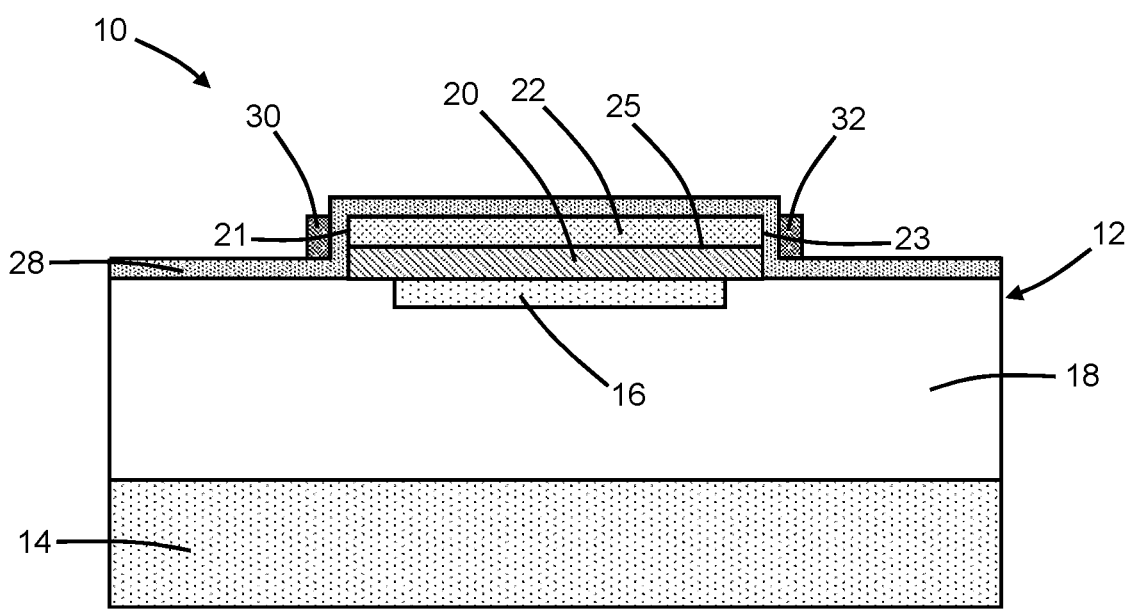

With reference to FIG. 2 in which like reference numerals refer to like features in FIG. 1 and at a subsequent fabrication stage of the processing method, conductive spacers 30, 32 are formed on portions of the switching layer 28. The conductive spacers 30, 32 are respectively positioned adjacent to the opposite side surfaces 21, 23 of the insulator layer 22. The conductive spacers 30, 32 are also respectively adjacent to the opposite side surfaces 24, 26 (FIG. 1) of the bottom electrode 20. The portions of the switching layer 28 respectively separate the conductive spacers 30, 32 from the opposite side surfaces 24, 26 of the bottom electrode 20 and the opposite side surfaces 21, 23 of the insulator layer 22.

In an embodiment, the conductive spacers 30, 32 may be comprised of a metal, such as tantalum, copper, or titanium, and may be formed by depositing a conformal layer on the switching layer 28 and etching the conformal layer with an anisotropic etching process, such as a reactive ion etching process. The bottom electrode 20 and the insulator layer 22 collectively provide a pillar used during the formation of the conductive spacers 30, 32. The pillar provides a non-planar topography for the deposition of the conformal layer and thereby defines locations adjacent to the side surfaces 21, 23 and side surfaces 24, 26 for the formation of the conductive spacers 30, 32 when the deposited conformal layer etched with the anisotropic etching process. The conductive spacers 30, 32 may be further etched with a cut mask to form disconnected sections associated with the structure 10 and adjacent structures (not shown) similar or identical to the structure 10.

Figure 3:
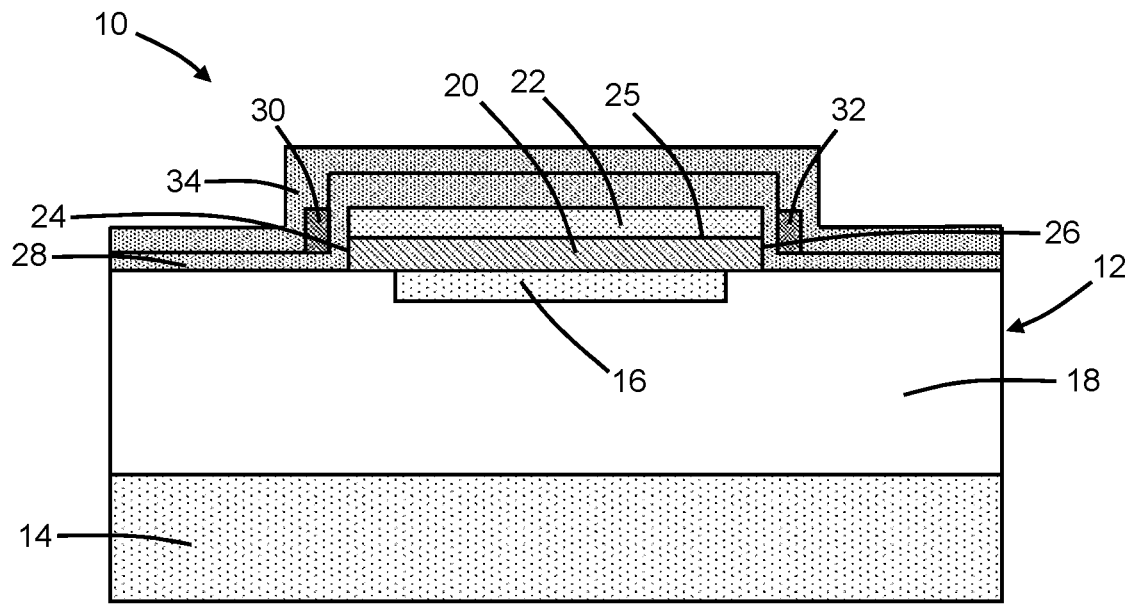

With reference to FIG. 3 in which like reference numerals refer to like features in FIG. 1 and at a subsequent fabrication stage of the processing method, a switching layer 34 is formed over the switching layer 28 and the conductive spacers 30, 32. In an embodiment, the switching layer 34 may be comprised of the same metal oxide as the switching layer 28. In an embodiment, the switching layer 34 may be comprised of a metal oxide, such as magnesium oxide, tantalum oxide, hafnium oxide, titanium oxide, aluminum oxide, or silicon dioxide, and may be conformally deposited with a nominally uniform thickness.

The conductive spacer 30 is disposed between a portion of the switching layer 28 and a portion of the switching layer 34, and these portions of the switching layers 28, 34 and the conductive spacer 30 are located adjacent to the side surface 24 of the bottom electrode 20 and the side surface 21 of the insulator layer 22. The conductive spacer 32 is disposed between a portion of the switching layer 28 and a portion of the switching layer 34 adjacent to the side surface 26 of the bottom electrode 20, and these portions of the switching layers 28, 34 and the conductive spacer 32 are located adjacent to the side surface 26 of the bottom electrode 20 and the side surface 23 of the insulator layer 22. The conductive spacers 30, 32 are surrounded by the switching layers 28, 34 to provide conductive features or islands that are embedded in the switching layers 28, 34. The switching layers 28, 34 may be considered to be a consolidated layer that includes the conductive spacers 30, 32 as embedded conductive features.

Figure 4:
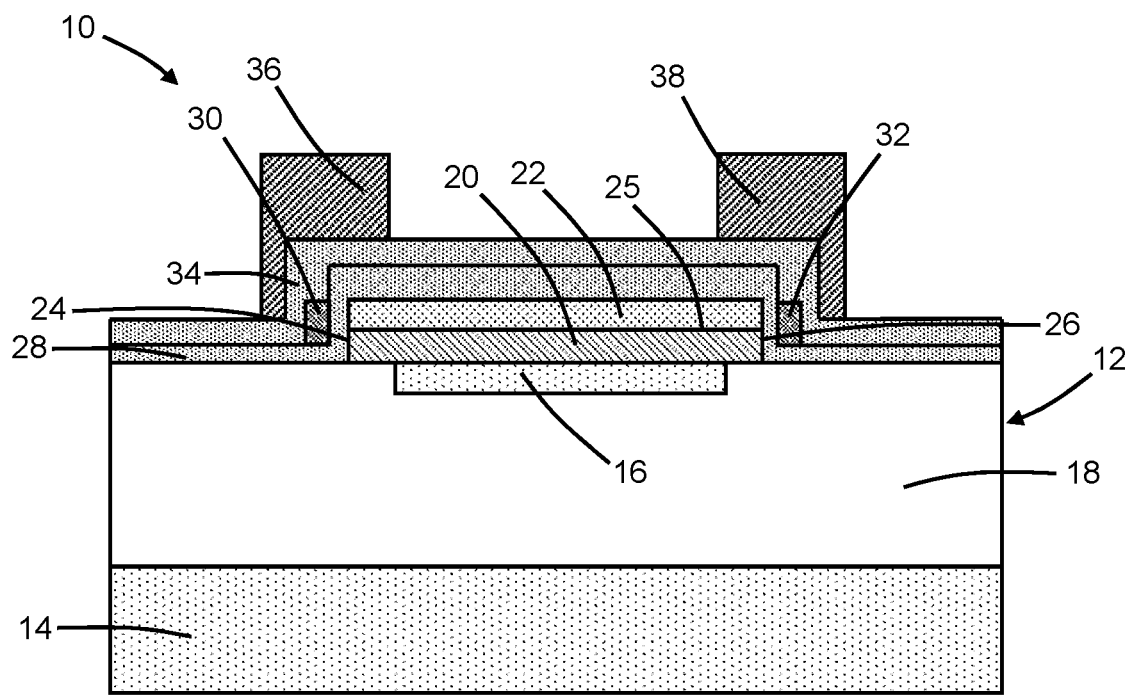

With reference to FIG. 4 in which like reference numerals refer to like features in FIG. 3 and at a subsequent fabrication stage of the processing method, a top electrode 36 and a top electrode 38 of the structure 10 are formed over the switching layer 34. In an embodiment, the top electrodes 36, 38 may be comprised of a metal, such as tantalum, hafnium, copper, silver, cobalt or tungsten, deposited by, for example, physical vapor deposition. The top electrodes 36, 38 may be formed by depositing a metal layer and patterning the metal layer with lithography and etching processes. In an embodiment, the top electrodes 36, 38 are comprised of a different metal than the conductive spacers 30, 32.

The top electrode 36 is positioned on the switching layer 34 adjacent and proximate to the side surface 24 of the bottom electrode 20, the side surface 21 of the insulator layer 22, and the conductive spacer 30. In an embodiment, the top electrode 36 may be positioned in direct physical and electrical contact with the switching layer 34. The conductive spacer 30 is positioned between the top electrode 36 and the side surface 24 of the bottom electrode 20 and between the top electrode 36 and the side surface 21 of the insulator layer 22. A portion of the switching layer 34 is positioned between the top electrode 36 and the conductive spacer 30.

The top electrode 38 is positioned on the switching layer 34 adjacent and proximate to the side surface 26 of the bottom electrode 20, the side surface 23 of the insulator layer 22, and the conductive spacer 32. In an embodiment, the top electrode 38 may be positioned in direct physical and electrical contact with the switching layer 34. The conductive spacer 32 is positioned between the top electrode 38 and the side surface 24 of the bottom electrode 20. A portion of the switching layer 34 is positioned between the top electrode 36 and the conductive spacer 32. The top electrodes 36, 38 therefore contact different portions of the switching layer 34.

Figure 5:
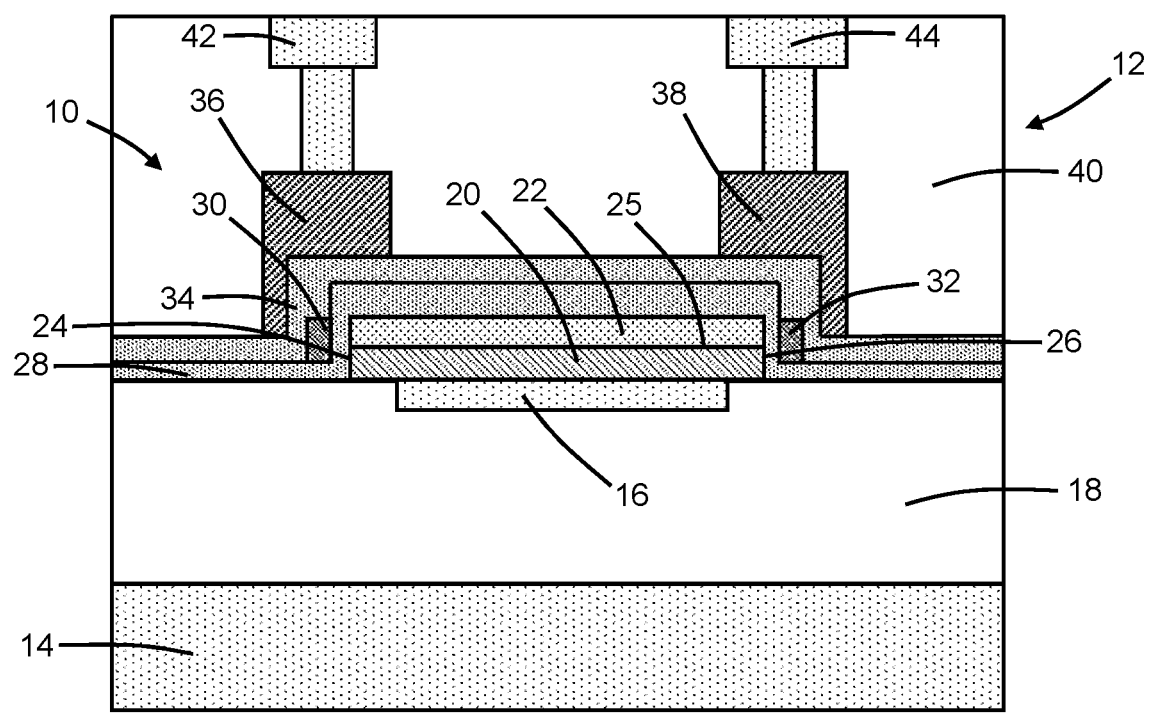

With reference to FIG. 5 in which like reference numerals refer to like features in FIG. 4 and at a subsequent fabrication stage of the processing method, an interlayer dielectric layer 40 of the interconnect structure 12 is formed over the structure 10. The interlayer dielectric layer 40 may be comprised of a dielectric material, such as silicon dioxide, similar to the interlayer dielectric layer 18. The interlayer dielectric layer 40 may be formed by depositing a layer of the dielectric material and planarizing with chemical-mechanical polishing. Bit lines 42, 44 are formed in the interlayer dielectric layer 40 and are respectively coupled to the top electrodes 36, 38 by conductive vias. The bit lines 42, 44 and conductive vias may be formed by patterning the interlayer dielectric layer 40, depositing one or more metals, and planarizing with chemical-mechanical polishing. The interlayer dielectric layer 40 defines a metallization level of the interconnect structure 12 that is arranged over the structure 10.

During use, filaments are formed in the switching layers 28, 34 proximate to the conductive spacers 30, 32 through the application of a suitable bias voltage. The conductive spacers 30, 32 function as conductive islands that effectively shorten the filament formation paths between the bottom electrode 20 and the top electrodes 36, 38 when programming the structure 10 to switch between low-resistance and high-resistance states. The conductive spacers 30, 32 are located adjacent to the upper corners of the bottom electrode 20 intersected by the top surface 25. Filaments are confined at the side surfaces 23, 24 of the bottom electrode 20 and, preferably, near the upper corners of the bottom electrode 20 at which the electric field is highest during operation. The insulator layer 22, which is situated on the top surface 25 of the bottom electrode 20, prevents the formation of filament paths between the top surface 25 and the top electrodes 36, 38.

Figure 6:
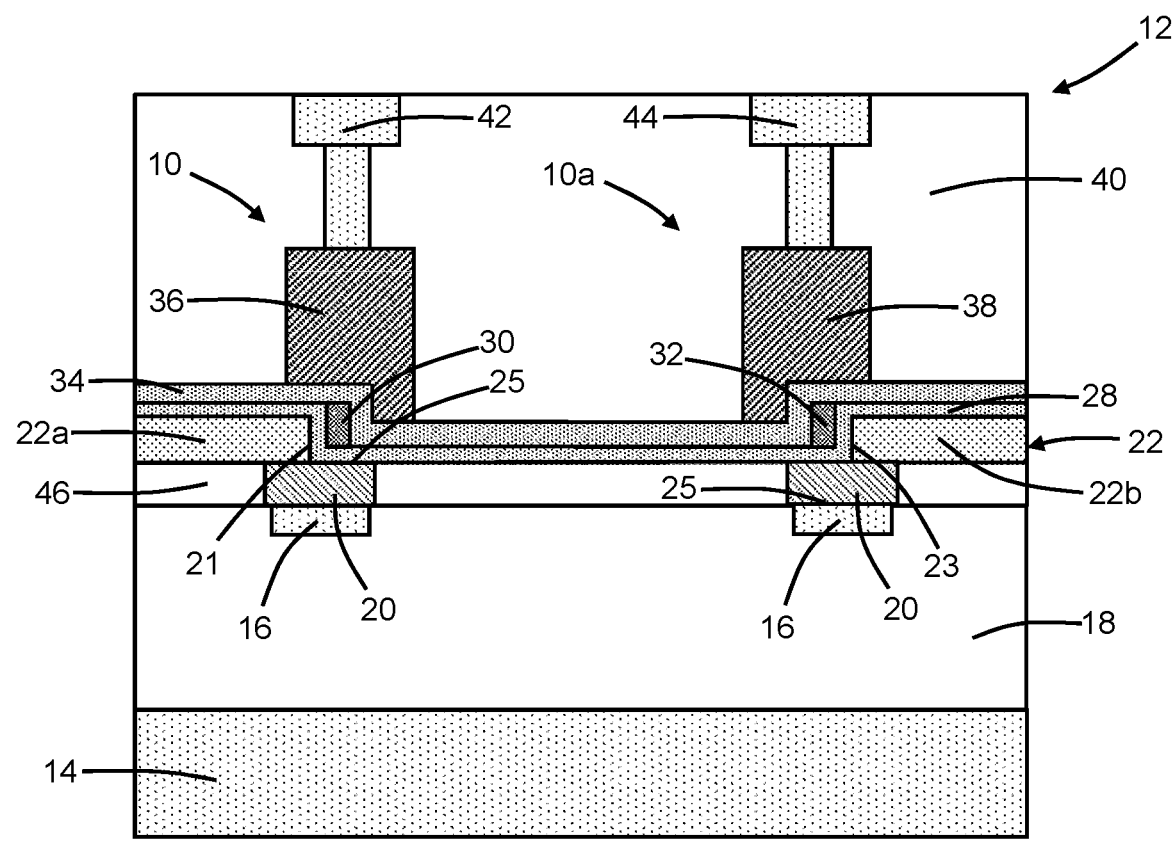
FIGS. 6-9 are diagrammatic cross-sectional views of structures for a resistive memory element in accordance with alternative embodiments of the invention.

With reference to FIG. 6 in which like reference numerals refer to like features in FIG. 5 and in accordance with alternative embodiments, the insulator layer 22 may be formed in sections 22a, 22b at laterally spaced-apart locations over separate bottom electrodes 20 that are patterned and then embedded in a dielectric layer 46. The section 22a of the insulator layer 22 is arranged over one of the bottom electrodes 20, and the section 22b of the insulator layer 22 is arranged over the other of the bottom electrodes 20. The switching layers 28, 34, the conductive spacers 30, 32 and the top electrodes 36, 38 are formed as previously described to define the structure 10 over one of the bottom electrodes 20 and to define a nominally-equivalent additional structure 10a for another resistive memory element over the other of the bottom electrodes 20.

The switching layer 28 includes a portion positioned on the top surface 25 of each bottom electrode 20, a portion positioned on the section 22a of the insulator layer 22, and a portion positioned on the section 22b of the insulator layer 22. The conductive spacer 30 is positioned over the top surface 25 of one of the bottom electrodes 20, and the conductive spacer 32 is positioned over the top surface 25 of the other of the bottom electrodes 20. The conductive spacer 30 is positioned between the top surface 25 of the bottom electrode 20 and the top electrode 36 with a portion of the switching layer 28 positioned between bottom electrode 20 and the conductive spacer 30 and a portion of the switching layer 34 between the top electrode 36 and the conductive spacer 30. The conductive spacer 32 is positioned between the top surface 25 of the bottom electrode 20 and the top electrode 38 with a portion of the switching layer 28 between the bottom electrode 20 and the conductive spacer 32 and a portion of the switching layer 34 between the top electrode 38 and the conductive spacer 32.

The sections 22a, 22b of the insulator layer 22 provide pillars that are used during the formation of the conductive spacers 30, 32. The pillars provide a non-planar topography and thereby define locations for the formation of the conductive spacers 30, 32 adjacent to the side surfaces 21, 23 of the insulator layer 22 when the conformal layer is deposited and etched with an anisotropic etching process to form the conductive spacers 30, 32.

Figure 7:
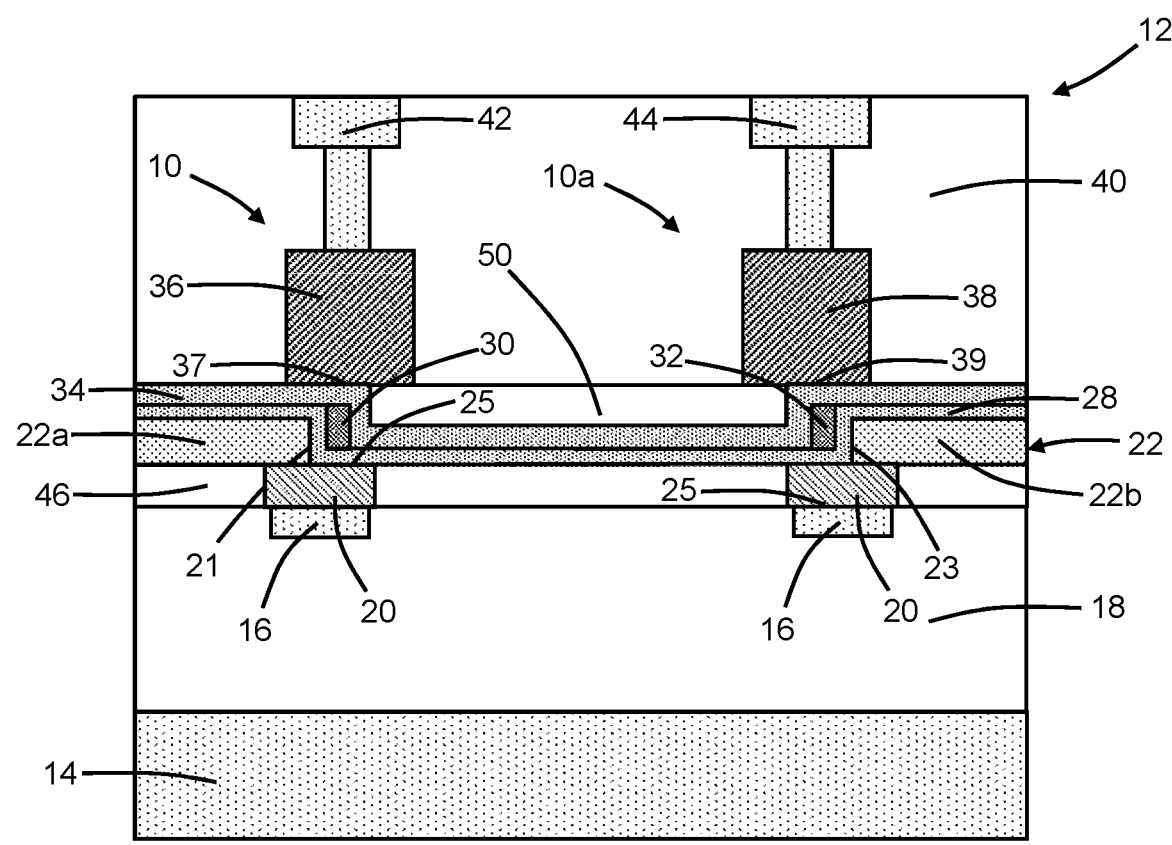

With reference to FIG. 7 in which like reference numerals refer to like features in FIG. 6 and in accordance with alternative embodiments, a dielectric layer 50 may be formed in the space between the sections 22a, 22b of the insulator layer 22 before the top electrodes 36, 38 are formed. The dielectric layer 50 may be comprised of a dielectric material, such as silicon dioxide. The dielectric layer 50 may be formed by depositing a layer of the dielectric material and planarizing with chemical-mechanical polishing. The dielectric layer 50 is formed after forming the switching layers 28, 34 and conductive spacers 30, 32 and before forming the top electrodes 36, 38. Each of the top electrodes 36, 38 includes a portion on the switching layer 34 and a portion on the dielectric layer 50, and the top electrodes 36, 38 have respective bottom surfaces 37, 39 that are substantially planar.

Figure 8:
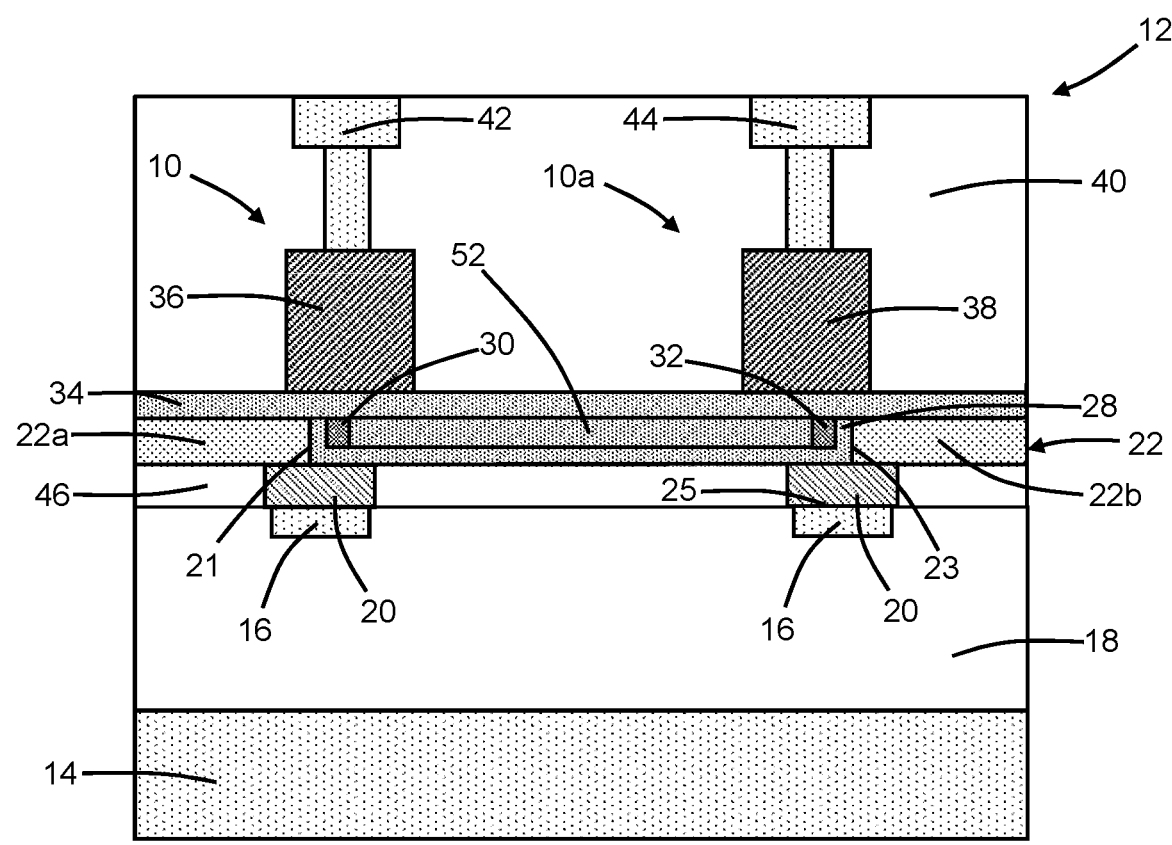

With reference to FIG. 8 in which like reference numerals refer to like features in FIG. 6 and in accordance with alternative embodiments, a switching layer 52 may be formed in the space between the sections 22a, 22b of the insulator layer 22 before the switching layer 34 and the top electrodes 36, 38 are formed. The switching layer 52 is formed after the conductive spacers 30, 32 are formed. The switching layer 52 may be comprised of a metal oxide, such as such as magnesium oxide, tantalum oxide, hafnium oxide, titanium oxide, aluminum oxide, or silicon dioxide, and may be conformally deposited with a nominally uniform thickness. The switching layer 52 may be polished following deposition with chemical-mechanical polishing and the sections 22a, 22b of the insulator layer 22 may function as a polish stop. The switching layer 52 and the sections 22a, 22b of the insulator layer 22 may be coplanar or substantially coplanar at their respective top surfaces. The switching layer 34 may be polished following deposition with chemical-mechanical polishing to provide a planar or substantially planar top surface. The top electrodes 36, 38 are disposed fully on the top surface of the switching layer 34 at locations that overlap with the locations of the conductive spacers 30, 32, and the respective bottom surfaces 37, 39 of the top electrodes 36, 38, which are fully positioned on the switching layer 34, are substantially planar.

Figure 9:
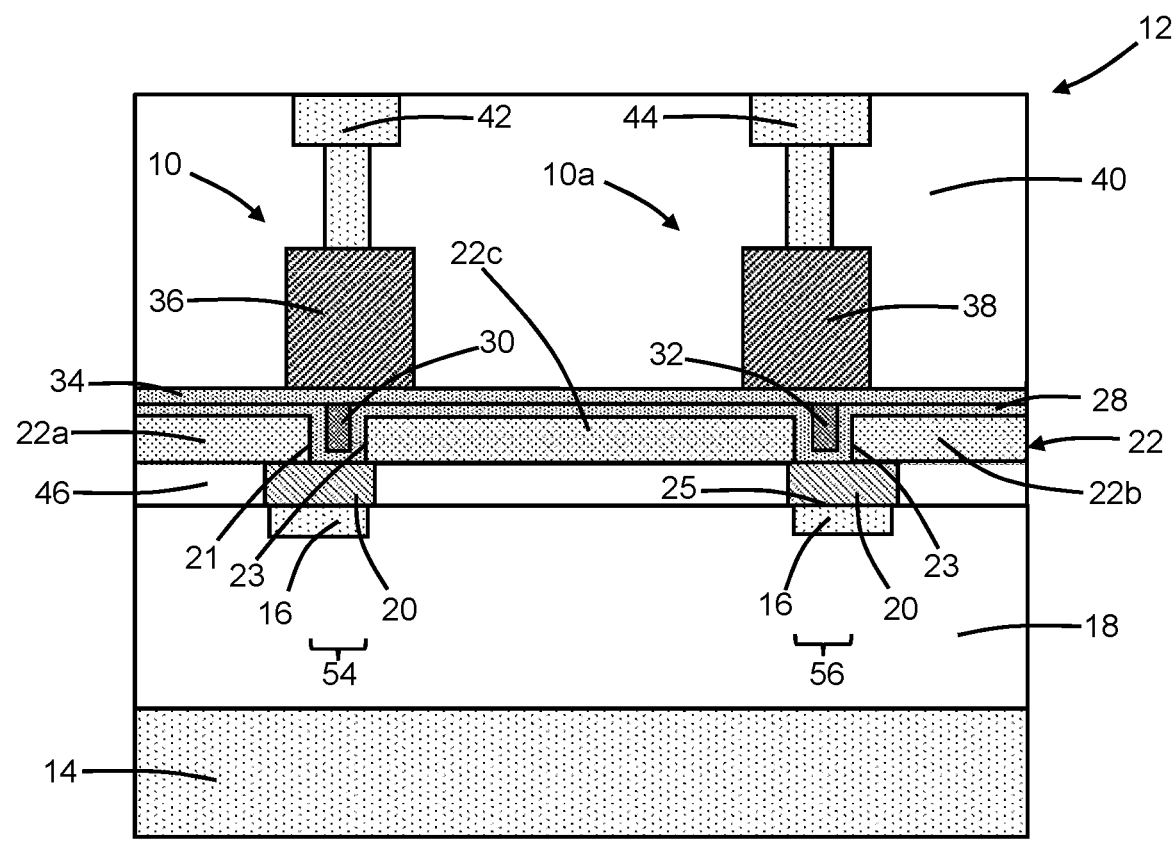

With reference to FIG. 9 in which like reference numerals refer to like features in FIG. 6 and in accordance with alternative embodiments, the insulator layer 22 may include an additional section 22c that is positioned between the section 22a and the section 22b of the insulator layer 22. The section 22a is spaced from the section 22c by a gap 54, and the section 22b is spaced from the section 22c by a gap 56. Portions of the bottom electrodes 20 are exposed by the gaps 54, 56. The switching layer 28 is conformally deposited such that the gaps 54, 56 are partially filled by the material of the switching layer 28. The conductive spacers 30, 32 are subsequently formed in the gaps 54, 56 by deposition and planarization.

The switching layer 34 is then formed by deposition and planarization, and the top electrodes 36, 38 are formed on the switching layer 34. The top electrode 36 is positioned on the switching layer 34 over the conductive spacer 30, and the top electrode 38 is positioned on the switching layer 34 over the conductive spacer 32. The respective bottom surfaces 37, 39 of the top electrodes 36, 38, which are fully positioned on the switching layer 34, are substantially planar. The conductive spacer 30 is positioned between the bottom surface 37 of the top electrode 36 and the portion of the bottom electrode 20 in the gap 54 between the sections 22a, 22c of the insulator layer 22. The conductive spacer 32 is positioned between the bottom surface 39 of the top electrode 38 and the portion of the bottom electrode 20 between in the gap 56 the sections 22b, 22c of the insulator layer 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a resistive memory element including a first switching layer, a second switching layer, a first conductive spacer, a first electrode, and a second electrode, the first switching layer including a first portion positioned between the first electrode and the first conductive spacer, the second switching layer including a first portion positioned between the second electrode and the first conductive spacer, and the first conductive spacer positioned between the first portion of the first switching layer and the first portion of the second switching layer.

2. The structure of claim 1 further comprising:
an insulator layer positioned on the first electrode, the insulator layer including a first side surface,
wherein the first conductive spacer is positioned adjacent to the first side surface of the insulator layer.

3. The structure of claim 2 wherein the insulator layer is comprised of a dielectric material.

4. The structure of claim 2 wherein the first electrode includes a top surface, and the insulator layer fully covers the top surface of the first electrode.

5. The structure of claim 2 wherein the first electrode includes a side surface, and the first conductive spacer, the first portion of the first switching layer, and the first portion of the second switching layer are positioned adjacent to the side surface of the first electrode.

6. The structure of claim 5 wherein the first portion of the first switching layer is in direct contact with the side surface of the first electrode.

7. The structure of claim 2 wherein the first electrode includes a top surface, and the insulator layer partially covers the top surface of the first electrode.

8. The structure of claim 2 wherein the first electrode includes a top surface, and the first conductive spacer, the first portion of the first switching layer, and the first portion of the second switching layer are positioned over a portion of the top surface of the first electrode.

9. The structure of claim 8 further comprising:
a dielectric layer adjacent to the first portion of the second switching layer,
wherein the second electrode includes a first portion over the first portion of the second switching layer and a second portion over the dielectric layer.

10. The structure of claim 9 wherein the second electrode includes a bottom surface on the first portion of the second switching layer and on the dielectric layer, and the bottom surface of the second electrode is substantially planar.

11. The structure of claim 8 wherein the resistive memory element further includes a third switching layer positioned adjacent to the first conductive spacer, and the third switching layer is positioned between the first switching layer and the second switching layer.

12. The structure of claim 11 wherein the second electrode includes a bottom surface fully on the second switching layer, and the bottom surface of the second electrode is substantially planar.

13. The structure of claim 8 wherein the insulator layer includes a first section and a second section separated by a gap over the portion of the top surface of the first electrode, and the first portion of the first switching layer and the first conductive spacer are positioned in the gap.

14. The structure of claim 1 wherein the resistive memory element includes a third electrode and a second conductive spacer, the first switching layer includes a second portion positioned between the first electrode and the second conductive spacer, the second switching layer includes a second portion positioned between the third electrode and the first conductive spacer, and the first conductive spacer is positioned between the second portion of the first switching layer and the second portion of the second switching layer.

15. The structure of claim 1 wherein the first electrode includes a side surface, and the first conductive spacer, the first portion of the first switching layer, and the first portion of the second switching layer are positioned adjacent to the side surface of the first electrode.

16. The structure of claim 1 wherein the first electrode includes a top surface, and the first conductive spacer, the first portion of the first switching layer, and the first portion of the second switching layer are positioned over a portion of the top surface of the first electrode.

17. A method of forming a structure for a resistive memory element, the method comprising:
forming a first electrode;
forming a first switching layer;
forming a conductive spacer on the first switching layer;
forming a second switching layer on the first switching layer and the conductive spacer; and
forming a second electrode on the second switching layer,
wherein the first switching layer includes a portion positioned between the first electrode and the conductive spacer, the second switching layer includes a portion positioned between the second electrode and the conductive spacer, and the conductive spacer is positioned between the first electrode and the second electrode.

18. The method of claim 17 further comprising:
forming an insulator layer positioned on the first electrode,
wherein the insulator layer includes a side surface, and the conductive spacer is formed adjacent to the side surface of the insulator layer.

19. The method of claim 17 wherein the first electrode includes a side surface, and the conductive spacer, the portion of the first switching layer, and the portion of the second switching layer are positioned adjacent to the side surface of the first electrode.

20. The method of claim 17 wherein the first electrode includes a top surface, and the conductive spacer, the portion of the first switching layer, and the portion of the second switching layer are positioned over a portion of the top surface of the first electrode.

* * * * *

UNITED STATES PATENT AND TRADEMARK OFFICE
CERTIFICATE OF CORRECTION

| | |
|---|---|
| PATENT NO. | : 11,398,525 B2 |
| APPLICATION NO. | : 17/009288 |
| DATED | : July 26, 2022 |
| INVENTOR(S) | : Desmond Jia Jun Loy, Eng Huat Toh and Shyue Seng Tan |

It is certified that error appears in the above-identified patent and that said Letters Patent is hereby corrected as shown below:

In the Claims

Column 8, Claim 14, Lines 32-33 read:
"portion positioned between the third electrode and the first conductive spacer, and the first conductive spacer is posi-"

It should read:
-- portion positioned between the third electrode and the second conductive spacer, and the second conductive spacer is posi- --

Signed and Sealed this
Twenty-ninth Day of April, 2025

Coke Morgan Stewart
*Acting Director of the United States Patent and Trademark Office*